United States Patent [19]

Martin

[11] 4,322,592
[45] Mar. 30, 1982

[54] SUSCEPTOR FOR HEATING SEMICONDUCTOR SUBSTRATES

[75] Inventor: John G. Martin, Scotch Plains, N.J.
[73] Assignee: RCA Corporation, New York, N.Y.
[21] Appl. No.: 181,376
[22] Filed: Aug. 22, 1980
[51] Int. Cl.³ .................. H05B 5/08; B05C 13/00
[52] U.S. Cl. .................. 219/10.49 R; 219/10.67; 118/500; 118/725; 118/730
[58] Field of Search .......... 118/500, 503, 728, 729, 118/730, 725, 900; 219/10.49 R, 10.67; 432/253; 148/175; 211/40, 41

[56] References Cited

U.S. PATENT DOCUMENTS

| | | | |
|---|---|---|---|
| 3,424,629 | 1/1969 | Ernst et al. | 118/730 X |
| 3,460,510 | 8/1969 | Currin | 118/725 X |
| 3,603,284 | 9/1971 | Garnache | 118/725 |
| 3,719,166 | 3/1973 | Gereth | 118/725 |
| 3,749,058 | 7/1973 | Slabaugh | 118/500 |
| 3,892,940 | 7/1975 | Bloem et al. | 219/10.49 R |
| 3,980,854 | 9/1976 | Berkman et al. | 219/10.49 R |
| 4,099,041 | 7/1978 | Berkman et al. | 219/10.49 R |

*Primary Examiner*—John D. Smith
*Assistant Examiner*—Bernard F. Plantz
*Attorney, Agent, or Firm*—Birgit E. Morris; Donald S. Cohen; Joseph D. Lazar

[57] ABSTRACT

An integral graphite susceptor of the barrel type comprising a hollow polyhedron arranged to support one or more semiconductor substrates on its outer planar wall surfaces. The substrates are supported in a novel column and row array in which each wafer is mounted on a wall surface portion that is related to the other adjacent wall surface portions in an equilateral triangular configuration to provide an efficient substrate support susceptor. Wafer edges extending beyond corners of the susceptor cause a disturbance in the gas flow resulting in more uniform deposition of epitaxial material.

7 Claims, 7 Drawing Figures

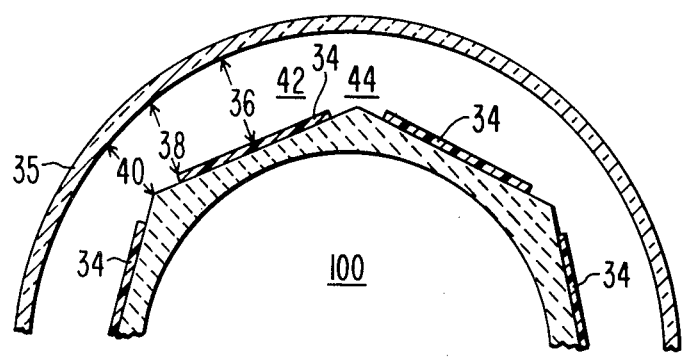
Fig. 3
PRIOR ART
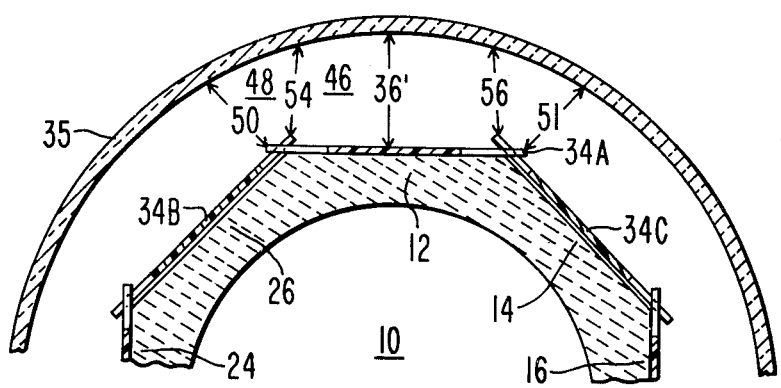
Fig. 4
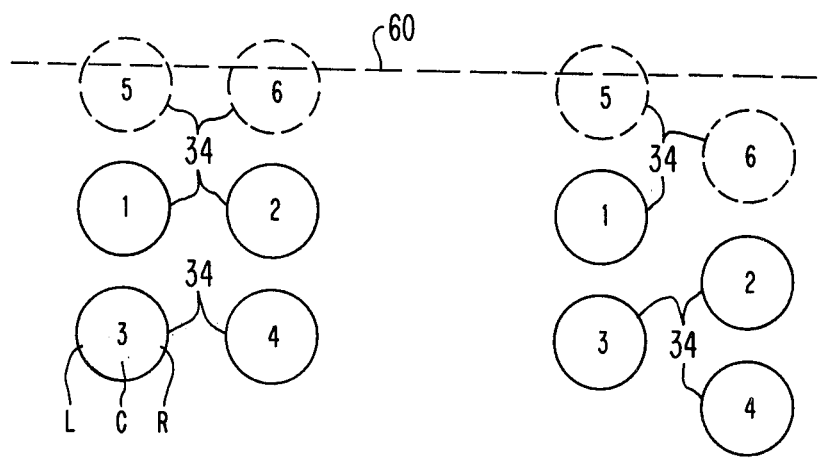
Fig. 6
PRIOR ART
Fig. 7

SUSCEPTOR FOR HEATING SEMICONDUCTOR SUBSTRATES

This invention relates to a susceptor of the barrel type comprising a hollow polyhedron adapted to support one or more substrates on an outer planar surface of each of the walls of the polyhedron.

In the production of certain semiconductor devices, an epitaxial layer of silicon on a substrate such as silicon wafer is used as a starting material. The epitaxial layer of silicon is deposited upon the silicon wafer in a chemical vapor deposition (CVD) process wherein the wafer is supported on a graphite susceptor and heated to a high temperature. A volatile compound of silicon is introduced and thermally decomposed or reacted with other gases or vapors at the surface of the wafer to yield silicon which deposits on the wafer surface.

Various types of susceptors have been utilized for supporting substrates during the chemical vapor deposition (CVD) process. In one type of apparatus, the substrates are mounted on the sides of a truncated pyramid-shaped polyhedron. This type of susceptor has been known as a barrel type susceptor and is used therefore in what are known as barrel reactors. One such barrel reactor is disclosed in U.S. Pat. No. 3,980,854, issued to Berkman et al. on Sept. 14, 1976 and assigned to the RCA Corporation. Another U.S. Pat. No. 4,099,041, issued to Berkman et al. on July 4, 1978 describes an improved form of a barrel reactor in which the heat distribution of the susceptor is improved by providing recesses in the inner walls of the susceptor.

The barrel susceptor by its nature of operation, is limited in the capacity of wafers that can be handled for each process step. For example, the usual reactor of this type is positioned within a cylindrical bell jar into which a stream of gas is injected at atmospheric or super-atmospheric pressures and drawn from within the bell jar by a suitable withdrawing means such as a suction pump. The pressure, flow rate and cross-section of the gas stream determines the amount and uniformity of material that can be deposited on the surfaces of the substrates as the gas stream passes through the bell jar. It is apparent that for a given susceptor the efficiency of the process of depositing material on the wafers is, in many respects, controlled by the amount of surface area that is being wasted with deposited material. In other words, the surface area of the susceptor that is not carrying a wafer or substrate for the process is waste. Such waste is reflected in the amount of chemicals per substrate that are being lost, the amount of gas that is needed to supply the reactor and indeed the amount of power that is used to operate the reactor.

Moreover, after every deposition cycle, the susceptor must be completely stripped clean before being reloaded for a subsequent run. This step of stripping the susceptor, typically using HCL gas, requires an etching time directly proportional to the amount of waste silicon deposited on the susceptor.

There is a need thus to improve the efficiency of such reactors by reducing the amount of wasted surfaces.

SUMMARY OF THE INVENTION

According to the present invention, the efficiency of utilizing the space on the barrel reactor is improved by a configuration of wafers in which the location for each substrate is one corner of an equalateral triangular formed with two other adjacent substrates.

BRIEF DESCRIPTION OF THE DRAWING

FIG. 3 is a fragmentary view partly in section of the wafers carried on the susceptor of the prior art in relation to the bell jar reactor chamber;

FIG. 4 is a fragmentary view partly in section taken along viewing line 4–4 of FIG. 1 of the susceptor of the invention for comparison to the susceptor of FIG. 3;

FIGS. 6 and 7 are schematics of wafer positions used in an experiment comparing the prior art susceptor to the susceptor of the invention.

Figure 1:
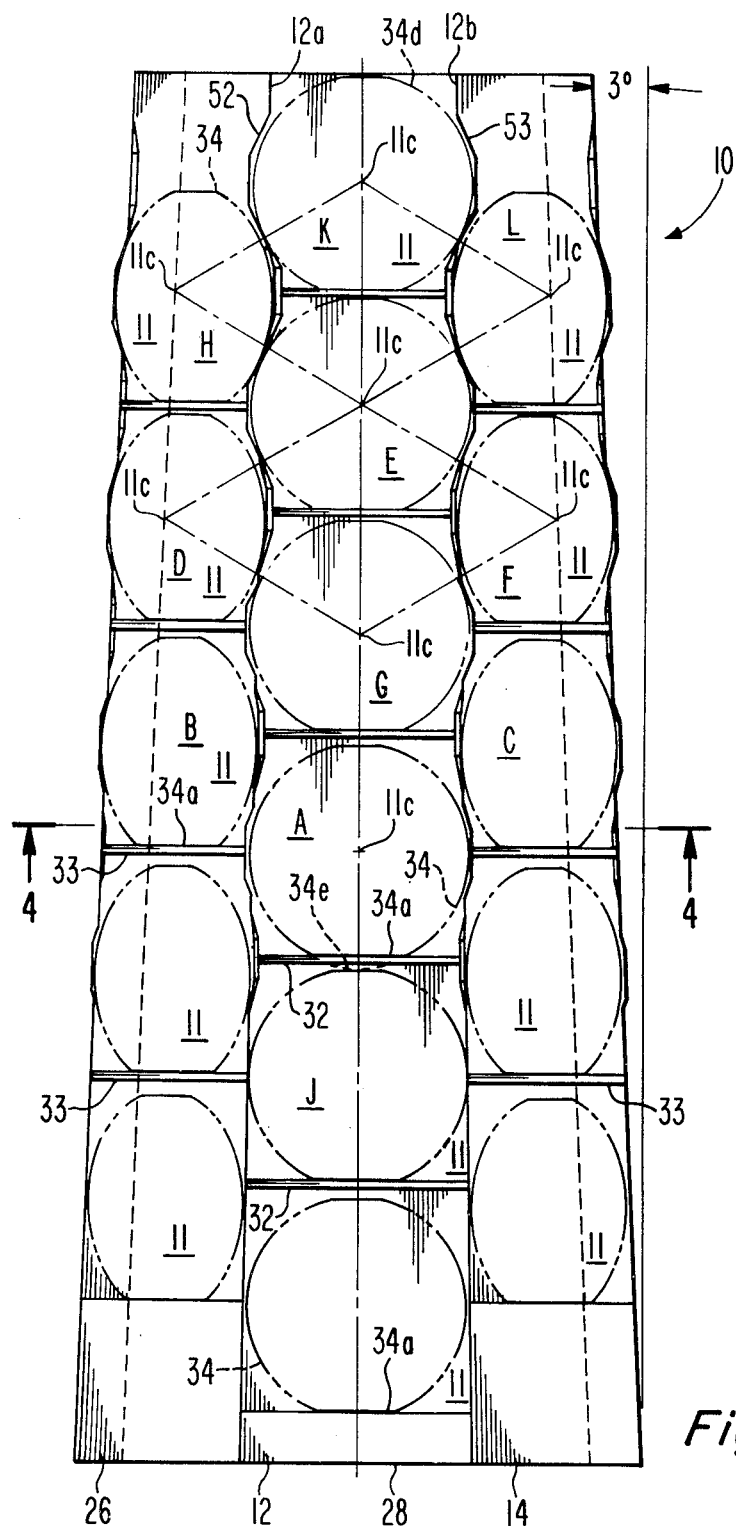
FIG. 1 is a side elevation view of a susceptor of the invention shown with wafers in place.
Figure 2:
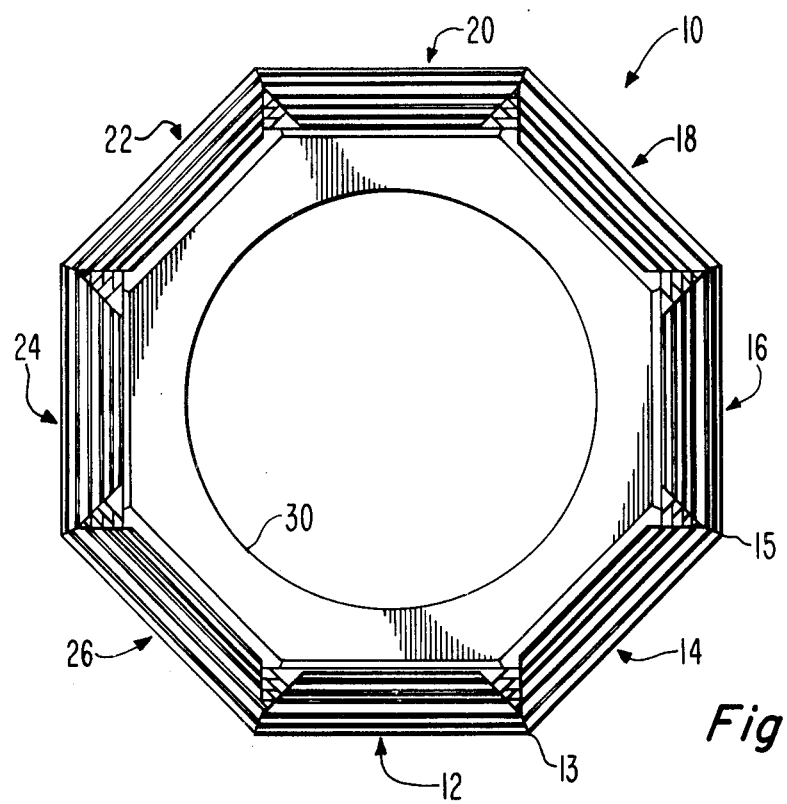
FIG. 2 is a top view of the susceptor shown in FIG. 1.

The susceptor 10 shown in FIGS. 1 and 2 is a truncated, pyramidal octahedron having eight walls 12, 14, 16, 18, 20, 22, 24 and 26. While the structure of the susceptor 10 is shown as an octagonal pyramid, it should be understood that any hollow polyhedron adapted to suit the requirements of a particular manufacturing process may be used in the practice of this invention. See the U.S. Pat. No. 4,099,041 to Berkman et al. mentioned above for details for constructing a suitable susceptor. The susceptor 10, in general, comprises an integral piece of conventional graphite which has been hollowed out by a machine tool. The susceptor shown is typically made by starting with a pyramid-shaped piece of graphite at the base 28 and machining out the inside whereby the inner surface 30 has a shape of a cone. Since the outer surfaces 12–28 are planar and the inner surface 20 is curved, the wall of such a susceptor where the planar surfaces intercept corner portions 13, 15, etc., are thicker than the central portions of the wall between the corners. A plurality of ledges 32 and 33 support the semiconductor substrates 34 against the outer surfaces of the walls. The upper and lower surfaces of the ledges 32 and 33 preferably extended circumstantially perpendicular from the planar surfaces from 0.6–0.7 mm. The thickness of each of the ledges is about 1.2–1.5 mm.

Each of the walls 12–26 of susceptor 10 is divided into a vertical array of surface regions 11. Each surface region 11 is arranged to provide sufficient surface area of the wall to support a substrate 34. For the lower portions of the wall where, due to the taper, the wall widths will be wider than the upper portions of the same wall, the surface region 11 will be an area larger than the area of the substrate 34. At the upper portions of the wall, regions 11 are of a width narrower than the diameter of a wafer so that the wafers 34 on such regions will extend beyond the wall surface. Thus, for example, the top wafer 34d extends beyond the corners 12a and 12b of the wall 12 defined by the intersection with the respective adjacent walls 26 and 14. In the preferred form of the invention, the surface region 11 has extensions 52 and 53 which overhang the wall corners as planar extensions of the surface region 11. By such an arrangement the entire surface of a wafer is in contact with a heating surface of the susceptor 10.

For a circular substrate 34 with a cordal cut-out 34a as shown for wafer A on wall 12, the diameter of the wafer 34 will be smaller, the same as, or slightly larger than the width of the surface region 11 supporting or depending on which portion of the susceptor wall the surface region 12 is located.

Furthermore, each of the surface regions 11 has a center 11c that is so located as to be substantially the geometric center of the surface region. Each surface region center 11c is designed to be coincident with the center of a circular wafer 34. The wafer, however, being typically provided with a cord 34a when mounted or supported on the surface region causes the center 11c to be displaced from the geometric center of the surface region. Each wafer is arranged to be supported on a ledge 32 or 33. The space between the ledges in a vertical pattern is such as to be slightly greater than the size of the wafer to be supported on the ledge. It will be noticed that if the cord 34a were absent and a wafer were circular as indicated by portion 34e of wafer A on column 12, the wafer J would nearly touch wafer A.

In the design layout of the regions 11 the respective centers 11c when connected by a substantially straight but bent line, allowing for the angular bend around the corner of the adjacent walls, defines an equilateral triangle. Thus, as illustrated in FIG. 1, a series of equilateral triangles are defined by the connection of the respective centers of 11c of the regions supporting wafers D, E, F, G, H, K and L. Moreover, the arrangement of wafers D, H, K, L, F and G about wafer E defines a hexagonal pattern. As is well known in the art, the packing density of circular regions is a maximum when arranged in a hexagonal pattern. Alternatively, maximum packing density occurs when three adjacent surface areas are arranged in an equilateral triangular pattern. Accordingly, this arrangement achieves maximum loading capacity of wafers on such a susceptor.

Accordingly, with the array so formed, as shown in FIG. 1, six substrates 34 may be mounted within six surface regions 11 on one wall, such as wall 12, while five substrates may be mounted on five surface regions 11 on adjacent walls, such as walls 14 and 26 of FIG. 1. It is for this irregular arrangement that the ledges 32 on wall 12 are not in alignment with the ledges 33 of walls 14 and 26.

While the wafers 34 described are circular or circular with a chordal cut-out 34e, the invention is useful for wafers that are of non-circular form. In particular, a wafer of hexagonal form may be supported on a surface region 11 specially arranged in a hexagon of substantially the same size as a hexagonal wafer.

Figure 5:
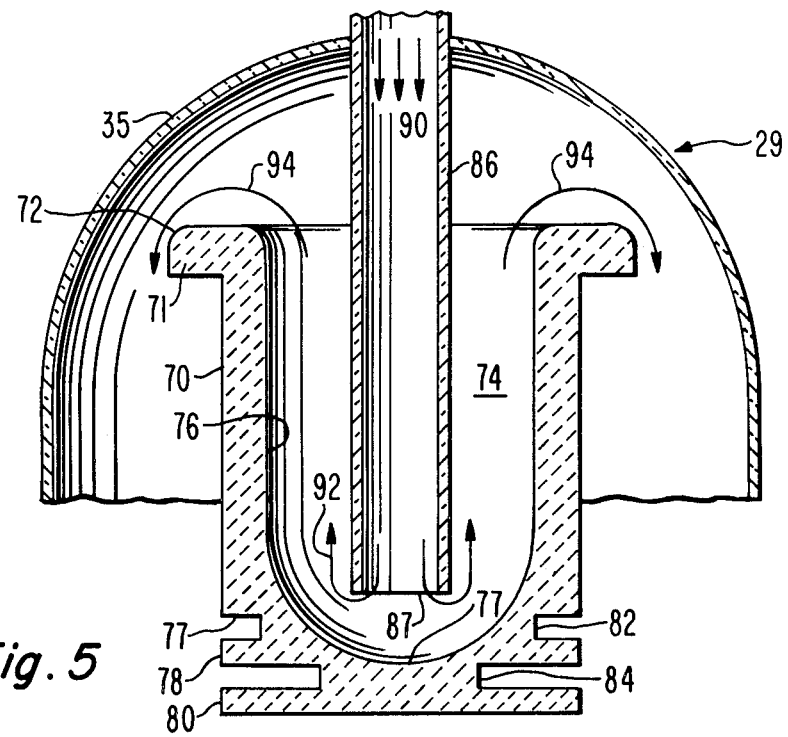
FIG. 5 is elevation view, partly in section of the preferred closure member of the susceptor of FIG. 1.

The susceptor 10 is provided with a top 29 which may be a simple planar graphite member to seal off the interior of the susceptor. Preferably, a top 29 is arranged to function as a preheater of the desposition gases that flow from the upper portion of the bell jar reaction chamber along the side walls of the susceptor. Such a top 29, as seen in FIG. 5, is a graphite cylinder 70 having preferably, although not necessarily, a first disc 78 and a second disc 80 integrally formed with the cylinder. An annular recessed portion 82 supports disc 78 and annular recessed portion 84 supports disc 80 to disc 78. Recessed portion 82 has a larger diameter than recessed portion 84. Discs 78 and 80, if used, serve as heat distribution vanes to reduce the concentration of heat at the bottom portion of cylinder 70. Cylinder 70 has a well 74 having a cylindrical wall 76 extending downwardly into smoothly curved bottom wall 77. An octagonal shoulder 71 having a smoothly curved surface portion 72 which extends into the well wall 76. A hollow glass tube 86 extends into well 74 from the central portion of the bell jar 35 for receiving the gas 90 indicated by the arrows.

In operation, gas 90 flowing through tube 86 at several pounds above atmospheric pressure passes downwardly and around the bottom 87 of the tube 86 as indicated by arrows 92 and then passes out of the well 74 over the curved surface of shoulder 71 as by arrows 94. The gases 90 are thereby heated by the top 70 which in turn is heated by the susceptor 10. In this way the gas 90 is essentially preheated to a higher temperature than it would be at if the gas 90 were to pass directly over the surface of the susceptor 10. It has been discovered by experiments that the gas by being preheated provides more uniform deposition of the upper-positioned wafers as compared to the lower-positioned wafers. Without preheating the gas 90 there is a tendency for the upper wafers to have thicker epitaxial depositions.

Referring now to FIG. 3, there is shown in a fragmentary sectional view of a susceptor 100 of the type disclosed in the aforementioned U.S. Pat. No. 4,099,041, taken at a section line comparable to viewing lines 4—4 shown in FIG. 1, with wafers 34 in position on the regions 11 provided on the walls of the susceptor. A bell jar reactor chamber 35 contains the prior art susceptor 100. The wafers are spaced from the inner wall of the reactor chamber 35 by the dimensions 36 and 38. The dimension 36 will be larger than the dimension 38 due to the circular curvature of the chamber 35. The dimension 40 represents the distance from a corner of the susceptor 100 to the inner wall of chamber 35. The region 42 generally between the wafer surface and the inner wall of chamber 35 is larger than the region 44 defined by the corners of the suspector 100 and the chamber 35. It is seen that the impedance to flow of the gas carrying the reactant particles will be less in the region 42 than the region 44. Accordingly, the epitaxial material deposited on the surface of the substrates 34 tends to be non-uniform with the maximum thicknesses generally in the vicinity of dimension 36 and less in the vicinity of the dimension 38. The movement of the gas 90 carried from the upper portion of the reaction chamber 35, or preferably from top 29 over shoulder 72, progresses downwardly to the bottom of the chamber 35 at which the gas is withdrawn. This movement occurs in generally a helical path since the susceptor 100 is rotated relative to the chamber 35. The flow phenomenon of the gas is however very complex and does not follow an easily determinable or predictable pattern. Nevertheless, it is speculated or theorized that the lower impedance to gas flow in the portions 42 generally cause more material to flow in the central portions of the 34 than in the peripheral portions.

Referring now to FIG. 4, there is shown a fragmentary cross-sectional view of a similar portion of the susceptor 20 along viewing lines 4—4 of FIG. 1. Wafers 34A, 34B and 34C are shown in position on the susceptor 10 within the regions on the walls 12, 26 and 14, respectively.

Wafer 34A, as seen in FIG. 4, extends beyond the vertical edges of the wall 12. Dimension 50 indicates the radial distance from the left corner of the wafer 34A to the inner wall of the chamber 35. Similarly, dimension 51 represents the radial dimension from the right corner of wafer 34A. Wafers 34B and 34C also extend beyond the vertical edges of the respective walls 26 and 14. The dimension 54 and 56 for the right and left corners of the wafers 34B and 34C correspond to the dimension 50 and 51 of wafer 34A. Dimensions 50, 51, 54 and 56 are smaller than the dimension 40 for the reactor shown in FIG. 3. Accordingly, the area at the corners of the wafers mounted on the susceptor, according to the invention shown in FIG. 4, is less than the corresponding area 44 of the prior art susceptor of FIG. 3. It appears thus that the impedance to the flow of gas according to the structure of FIG. 4 is changed advantageously by tending to make the impedance in the areas 46 and 48 more nearly equal than the impedance in the areas 42 and 44 of the prior art structure shown in FIG. 3.

The susceptor 10 is adapted for use in a typical vertical reactor furnace heated by electrical induction energy of about 10–400 kHz or other means of thermal energy so that a material can be deposited onto the substrates 34 from reacting chemical components in a CVD process as well known in the art. The susceptor 10 is usually heated by circular RF induction coils (not shown) which surround the graphite susceptor 10 and induce a current therein. Typically, the coils are mounted around the bell jar chamber 35 into which the susceptor 10 is placed. The dimensions of the susceptor 10 are not critical. The following dimension values are for illustrative purposes. The wall 12 of the susceptor 10 at the corner portions 13, 15, etc., is about 15–20 mm in thickness and about 8–12 mm in thickness at the central portions of the wall 30. The height of the susceptor is about 300–500 mm and the ledges 33 and 34 protrude enough to maintain the substrates 34 in place without substantially interfering with the sensitive gas flow dynamics of the reacting chemical components within the furnace. This is achieved when each of the planar surfaces 12–26 makes about a 3° angle with the vertical. With such a structure and arrangement the substrates 34 will be maintained in position. In some instances, it may be necessary to provide a suitably inert adhesive behind the substrate to hold the substrate in position.

The susceptor is typically rotated within a bell jar 35 by a motor means (not shown) so that the gases 94 that are flowing in a helical path usually from the top portion (72) of the susceptor to the bottom along the outer surfaces thereof are made more uniform. To provide more uniform heat distribution as the susceptor is heated, pyrolytic graphite heat shields (not shown) are preferably provided in recesses in the inner surface wall 30 near each of the substrate supporting regions 11 on the outer walls. The details for providing such heat shields are described in detail in the aforementioned U.S. Pat. Nos. 4,099,041 and 3,980,854.

In operation, the susceptor 10 is typically heated by electrical induction energy such as produced by electrical oscillations at 10–400 kHz from energizing coils surrounding the susceptor (not shown). The susceptor 10 attains an elevated temperature of about between 1,000° C. and 1,200° C., for example, Reacting chemical components, such as silicon tetrachloride and hydrogen are introduced into the reactor furnace bell jar 35 containing the susceptor 10 so as to pass via preheating top 90 over the substrates mounted on the walls 12–26. Silicon, the reduced reaction product of the reacting chemical components, deposits upon the exposed surfaces of the substrates 34. The reaction mentioned above is a temperature-dependent one, and the silicon tends to deposit more on the hotter surfaces than the cooler ones. Furthermore, because the passage of the gas between the susceptor 10 and the bell jar 35 tends to be uneven, there is a tendency for a greater deposition of material on the central portion of the substrate.

According to an experimental run made with the susceptor made in accordance with the present invention, it was demonstrated that the wafers were more uniformly deposited with epitaxial material than material deposited on corresponding wafers in the prior art reactor illustrated in U.S. Pat. No. 4,099,041 described hereinabove. More particularly, four wafers 34 were positioned on the prior art susceptor 100 (FIG. 3) such that the wafers 34 were mounted as shown in FIG. 6 in what may be termed a rectangular array. Then, a set of four wafers 34 were arranged on a susceptor 10 (FIG. 4) in a triangular pattern as shown in FIG. 7. The top tier of wafers positioned along line 60 shown common to FIGS. 5 and 6 are supporting wafers 5 and 6 in the rectangular array of FIG. 6 and wafers 5 and 6 in the triangular array of FIG. 7. A tabulated result of the thicknesses of epitaxial growth on each of the four wafers for both the prior art susceptor 100 and the susceptor 10 according to the present invention are tabulated below, the thicknesses being in micrometers. The symbols L, C and R represent, the left portion, the center portion and the right portion of each wafer as illustrated for wafer 3 in FIG. 6.

| Wafer No. | Susceptor 100 | | | Susceptor 10 | | |
|---|---|---|---|---|---|---|
| | L | C | R | L | C | R |
| 1 | 10.2 | 10.4 | 10.2 | 13.0 | 13.2 | 13.2 |
| 2 | 13.0 | 13.0 | 13.0 | 13.6 | 13.6 | 13.6 |
| 3 | 13.2 | 13.2 | 13.2 | 13.2 | 13.2 | 13.5 |
| 4 | 12.6 | 12.6 | 12.6 | 13.4 | 13.4 | 13.4 |

It will be noticed that the maximum deviation in thickness among the wafers 1–4 for the prior art susceptor 100 is 3.0 while the maximum deviation in thickness of the four wafers grown on susceptor 10 is 0.6, an improvement factor of five. The reason for this significant improvement in the uniformly deposited epitaxial material is not fully understood, but as indicated above, it seems that by the alteration in the flow path of the gas caused by the extended peripheral portions of the wafers into the adjacent wall regions of the susceptor contributes to that result.

The configuration of the tapered susceptor walls of the embodiment described is such that the regions 11 in the lower portion are larger than the wafers. Accordingly, such wafers will not extend over the adjacent walls to effect the gas flow disturbance occuring at the upper regions. Nevertheless, whatever alteration in the gas flow is caused by the upper extending wafers will be continued substantially into such lower regions.

There has thus been described and illustrated by the above-described embodiment of a novel susceptor a way to increase the capacity in the number of substrates that can be processed per batch in a chemical vapor deposition barrel reactor of a given size. For example, a barrel reactor of conventional form such as described in U.S. Pat. No. 4,099,041 arranged to provide seven faces to carry five wafers on each face can be modified according to the teachings of this invention to provide on four alternate faces, six wafers on each face, and, on three alternate faces, five wafers on each such face. With such an arrangement the space saving on the susceptor walls is increased by 15%. As a consequence there is an overall 15% improvement in operating costs and yield for each use of the susceptor over the prior art susceptor.

Moreover, because of the unique configuration of the hexagonal pattern in which the substrates are staggered around the susceptor, the extension of the edges of the substrates 34 beyond the corners of the susceptor causes a distortion of the gas passage to reduce the impedance to gas flow uniformly. This results, it seems, in a decrease in the flow rate in the central portion (46) of the passageway reducing the deposition thickness in the central portion of the wafer. Accordingly, the overall wafer thickness of the respective wafers tends to become more uniform.

What is claimed is:

1. In a susceptor of the type comprising a hollow polyhedron having a plurality of walls, each wall adapted to support on its outer planar surface one or more substrates in nearly vertical orientation, each of said substrates being generally polygonal or circular of a given diameter and having a center, the improvement comprising:

each wall being subdivided into a plurality of surface regions in vertical alignment, said regions being bounded by horizontal edges that are spaced slightly larger than one of said substrates, each surface region having a center, each region being arranged further to support one of said substrates, the center of the supported substrate being substantially coincident over the center of the region;

a plurality of ledges each adapted to support a substrate placed on the associated surface region, each one of said ledges extending along the associated lower horizontal edge of each one of said surface regions; and the ledges of respective adjacent walls being displaced such that substrates on adjacent walls when supported on the ledges are not horizontal alignment, wherein the susceptor is a truncated pyramid, the wall widths being tapered such that the width of the upper portions of each wall is narrower than the diameter of the substrate and the lower portion of each wall is slightly larger than the diameter of the substrate, the surface regions in one or more of the upper wall portions having a width less than the substrate whereby the edges of the supported substrate will extend beyond the corner of the intersecting walls.

2. In a susceptor according to claim 1 wherein the lines between the centers of the respective surface regions on adjacent walls define substantially an equilateral triangle whereby the substrates supported on said susceptor are generally in a hexagonal pattern.

3. In a susceptor according to claim 1, wherein said polyhedron has eight walls.

4. In a susceptor according to claim 1, further including a closure member for closing the top open end of the susceptor, said member being generally a hollow cylinder having a closed end and an open end, a shoulder extending radially outwardly from the open end and adapted to rest on the upper walls of the susceptor, the shoulder having a concave curved surface smoothly shaped into the inner wall of the cylinder, the bottom wall of the cylinder being smoothly curved to extend outwardly with the inner wall of the cylinder.

5. In a susceptor according to claim 4 further including a hollow tube supported to extend into the hollow cylinder of the closure member.

6. In a susceptor according to claim 4, wherein the closure member further includes one or more discs supported from the bottom of the cylinder with annular recessed portions between the discs.

7. In a susceptor according to claim 1, wherein one or more of said surface regions has a surface area less than the surface area of a substrate, said wall further including a planar extension surface of the surface region extending across the corner with the adjacent wall to support the portion of the substrate extending beyond the surface region.

* * * * *